US 9,448,273 B2

(12) United States Patent
Kattainen et al.

(10) Patent No.: US 9,448,273 B2
(45) Date of Patent: Sep. 20, 2016

(54) INTERFACE UNIT, CONVEYING SYSTEM AND METHOD

(71) Applicants: Ari Kattainen, Hyvinkaa (FI); Antti Hovi, Hyvinkaa (FI)

(72) Inventors: Ari Kattainen, Hyvinkaa (FI); Antti Hovi, Hyvinkaa (FI)

(73) Assignee: Kone Corporation, Helsinki (FI)

( * ) Notice: Subject to any disclaimer, the term of this patent is extended or adjusted under 35 U.S.C. 154(b) by 555 days.

(21) Appl. No.: 13/913,884

(22) Filed: Jun. 10, 2013

(65) Prior Publication Data

US 2013/0271152 A1    Oct. 17, 2013

Related U.S. Application Data

(63) Continuation of application No. PCT/FI2011/000052, filed on Dec. 8, 2011.

(30) Foreign Application Priority Data

Dec. 14, 2010  (FI) .................................... 20106319

(51) Int. Cl.
   *G01R 31/28*   (2006.01)
   *B66B 5/00*    (2006.01)

(52) U.S. Cl.
   CPC ............. *G01R 31/28* (2013.01); *B66B 5/0093* (2013.01)

(58) Field of Classification Search
   CPC  G01R 31/28; G01R 31/2812; G01R 31/282; G01R 31/2827; G01R 31/2829; B66B 5/00; B66B 5/0087; B66B 5/0093
   See application file for complete search history.

(56) References Cited

U.S. PATENT DOCUMENTS

| 5,407,028 A | 4/1995 | Jamieson et al. |
| 6,056,088 A * | 5/2000 | Gerstenkorn ......... B66B 5/0031 187/390 |
| 6,446,760 B1 * | 9/2002 | Lisi ...................... B66B 5/0031 187/391 |
| 7,482,771 B2 * | 1/2009 | Hahn ..................... G05B 19/19 187/209 |
| 2006/0157305 A1 * | 7/2006 | DePlazes ............... B66B 5/0031 187/391 |
| 2007/0007087 A1 * | 1/2007 | Matsuoka ................ B66B 5/02 187/391 |
| 2007/0284195 A1 | 12/2007 | Roschier et al. |
| 2010/0127711 A1 * | 5/2010 | Chen .................. G01R 31/2829 324/522 |
| 2010/0141267 A1 | 6/2010 | Quinn |

FOREIGN PATENT DOCUMENTS

| CN | 1291584 A | 4/2001 |
| CN | 101146730 A | 3/2008 |
| DE | 102006044631 A1 | 3/2007 |
| EP | 1852382 A1 | 11/2007 |
| JP | S5936079 A | 2/1984 |

(Continued)

OTHER PUBLICATIONS

Japanese Office Action dated Jul. 31, 2015 issued in corresponding Japanese Application No. 201.3-543843 (English translation provided).

(Continued)

*Primary Examiner* — Tung X Nguyen
*Assistant Examiner* — David Frederiksen
(74) *Attorney, Agent, or Firm* — Harness, Dickey & Pierce, P.L.C.

(57) ABSTRACT

The invention relates to an interface unit, a conveying system and a method. The interface unit comprises an input circuit for the signal determining the safety of the conveying system. The interface unit further comprises means for testing the operating condition of the input circuit.

23 Claims, 2 Drawing Sheets

(56) References Cited

FOREIGN PATENT DOCUMENTS

| | | |
|---|---|---|
| WO | WO-2006048498 A1 | 5/2006 |
| WO | WO-2010103655 A1 | 9/2010 |

OTHER PUBLICATIONS

Chinese Office Action dated Feb. 3, 2015 issued in corresponding Chinese Application No. 201180067589.1 (English translation).

International Search Report PCT/ISA/210 for PCT/FI2011/000052 dated Feb. 21, 2012.

Written Opinion PCT/ISA/237 for for PCT/FI2011/000052 dated Feb. 21, 2012.

Finnish Search Report for Finnish Application No. 20106319 dated May 4, 2011.

* cited by examiner

INTERFACE UNIT, CONVEYING SYSTEM AND METHOD

This application is a continuation of PCT International Application No. PCT/FI2011/000052 which has an International filing date of Dec. 8, 2011, the entire contents of which are incorporated herein by reference, and which claims priority to Finnish patent application number 20106319 filed Dec. 14, 2010.

FIELD OF THE INVENTION

The invention relates to the testing of the operating condition of the safety circuit of a conveying system.

BACKGROUND OF THE INVENTION

The design instructions and design regulations concerning the safety circuits of conveying systems, more particularly of elevators, are changing, as a result of, among other things, developments in microprocessor technology and software technology. As a consequence of new design instructions and design regulations, electronic safety circuits based on microprocessor control and on data bus architecture can be designed. A number of sensors measuring the operation of an elevator, for example, can be connected to the same data bus, and the operation of an elevator can be monitored with a separate electronic supervision unit connected to the data bus.

The purpose of the safety circuit of an elevator is to ensure the safe operation of the elevator in all operating situations. In this connection, also, in the revised EN 81 elevator standard at least a SIL 2 or SIL 3 safety integrity level is required of many basic elements of electronic safety circuits such as of microprocessor-controlled supervision units, data buses, sensors, measuring cables, et cetera. For achieving an adequate safety level, the aforementioned basic elements must often be duplicated; duplication, on the other hand, increases the amount of components, circuits and wiring needed.

As circuits and wiring increase and become more complex, the risk of a connection error or of a wiring error, of connection of the wrong voltage to conductors, et cetera, also increases. The operating voltage for devices to be connected is also often carried in the same cable as the signal conductors. A breakage of the insulation of a conductor might cause a short-circuit or the connection of operating voltage to a signal conductor. Owing to the aforementioned reasons, among others, there is a need for simpler and more reliable electronic safety circuits than those now known in the art.

AIM OF THE INVENTION

The aim of the invention is to bring an improvement to the problem for simplifying electronic safety circuits, more particularly by improving the diagnostics of electronic safety circuits. To achieve this aim the invention discloses an interface unit according to claim 1, a conveying system according to claim 16 and also a method according to claim 17. The preferred embodiments of the invention are described in the dependent claims.

SUMMARY OF THE INVENTION

The interface unit according to the invention for the safety circuit of a conveying system comprises an input circuit for the signal determining the safety of the conveying system. The interface unit further comprises means for testing the operating condition of the aforementioned input circuit. The interface unit according to the invention is preferably an electronic interface unit. The monitoring of the operating condition of the input circuit according to the invention enables e.g. the connection of SIL 3 safety level safety switches or corresponding components to the input circuit without the need to duplicate the components in question and/or the data transfer channels of the components in question.

In a preferred embodiment of the invention the interface unit comprises means for disconnecting the signal to be supplied to the input circuit, said signal determining the safety of the conveying system. The interface unit is configured to determine the operating condition of the input circuit when the aforementioned signal determining the safety of the conveying system has been disconnected. Consequently, the operating condition of the input circuit can be monitored without the signal/change in the signal determining the safety of the conveying system affecting the monitoring of the operating condition.

In a preferred embodiment of the invention the signal determining the safety of the conveying system is formed with a sensor measuring a safety-critical property of the conveying system, which sensor is most preferably a safety switch or a series circuit of safety switches connected to the input circuit. The means for disconnecting the signal determining the safety of the conveying system is in this case configured to disconnect the electricity supply of the sensor, most preferably a safety switch or a series circuit of safety switches, measuring a safety-critical property of the aforementioned conveying system.

In a preferred embodiment of the invention the interface unit comprises means for supplying a testing signal to the input circuit. The interface unit is configured to supply a testing signal to the input circuit when the signal determining the safety of the conveying system has been disconnected.

In some embodiments the interface unit comprises a communications circuit for sending a message to the communications bus in the safety circuit of the conveying system. Consequently, with the interface unit information about the operating status of a conveying system expressed by a signal determining the safety of the conveying system can be sent onwards to one or more nodes in the communications bus, which improves the diagnostics of the conveying system, more particularly in relation to the safety of the conveying system.

In a preferred embodiment of the invention the input circuit comprises a node for duplicating the signal path of a signal arriving in the input circuit. In some embodiments the interface unit comprises two signal-processing elements and of the aforementioned duplicated signal paths the first is taken from the node to the first signal-processing element and the second is taken from the node to the second signal-processing element. In some embodiments of the invention, the aforementioned first and second signal-processing elements comprise a microprocessor. The interface unit preferably comprises in this case a memory, most preferably a separate memory for each microprocessor, in which memory/memories a program to be executed is stored. A duplicated signal path increases the redundancy of the input circuit and consequently improves the reliability of the input circuit. At the same time also monitoring of the condition of the input circuit can be improved.

In a preferred embodiment of the invention the interface unit is configured to supply the first testing signal to the first of the duplicated signal paths and the second testing signal to the second of the duplicated signal paths. In the most preferred embodiment of the invention the interface unit is configured to supply a testing signal in turn to both of the duplicated signal paths. The interface unit is configured to determine a fault situation in the input circuit, if the first testing signal supplied to the first of the duplicated signal paths in this case causes a change that is larger than permitted in the second of the duplicated signal paths, and vice versa. In addition, the interface unit is configured to determine a fault situation in the input circuit, if the first testing signal supplied to the first of the duplicated signal paths causes a change that is smaller than permitted in the first of the duplicated signal paths, and vice versa. By testing in turn both of the duplicated signal paths, the operating condition of both signal paths can be assured by comparing the testing results.

In a preferred embodiment of the invention the input circuit comprises a connection for two or more signals determining the safety of the conveying system and the interface unit is configured to determine in turn the operating condition of the signal path of each different signal arriving in the connection circuit. By the aid of this type of testing sequence the operating condition of all the channels of the input circuit can be determined centrally and essentially simultaneously, which improves the reliability of testing and reduces e.g. the effect of environmental factors on testing results.

In a preferred embodiment of the invention the interface unit is configured to determine the operating condition of the input circuit when all the signals arriving in the input circuit that determine the safety of the conveying system have been disconnected.

The invention also relates to a conveying system, which comprises an interface unit according to one or some of the embodiments presented above for the safety circuit of a conveying system.

The invention also relates to a method for monitoring the operating condition of an input circuit in the safety circuit of a conveying system. In the method according to the invention the operating condition of the input circuit is monitored with means fitted in connection with the input circuit.

In a preferred embodiment of the invention a signal to be supplied to the input circuit, said signal determining the safety of the conveying system, is disconnected and also the operating condition of the input circuit is determined when the aforementioned signal determining the safety of the conveying system has been disconnected. The aforementioned signal to be supplied to the input circuit is disconnected most preferably by disconnecting the electricity supply of a sensor measuring a safety-critical property of the conveying system.

In a preferred embodiment of the invention a testing signal is supplied to the input circuit when the aforementioned signal determining the safety of the conveying system has been disconnected.

In the most preferred embodiment of the invention the signal path of the arriving signal is duplicated in the input circuit and also a testing signal is supplied in turn to both of the duplicated signal paths.

In the most preferred embodiment of the invention a safety switch and/or a series circuit of safety switches is connected to the input circuit.

In some embodiments of the invention, when it is detected that the input circuit of a connection device has failed, information about the failure is sent via a communications bus to an electronic supervision unit in the safety circuit of the elevator. When it receives the fault information from the communications bus the electronic supervision unit forms a control command for switching the software of the elevator system into an operating mode in which the next run of the elevator is prevented. For preventing the run, the electronic supervision unit also controls the safety breaker of the elevator, which disconnects the current supply to the hoisting machine of the elevator and also activates the machinery brakes of the hoisting machine by preventing the current supply to the electromagnets of the machinery brakes. The electronic supervision unit executes the aforementioned procedures also when it determines a fault situation in its own input circuit in the manner presented in the invention.

In some embodiments of the invention, information about an observed failure of the input circuit is sent to a service center via a data transfer link. In this way the diagnostics of the elevator can be improved, more particularly relating to the remote monitoring/remote operation of the elevator. The aforementioned data transfer link can be e.g. an Internet connection or a corresponding wireline connection; the data transfer link can also be implemented wirelessly, e.g. with a GSM connection or with a corresponding data transfer connection based on electromagnetic radiation.

In some preferred embodiments of the invention, two resistors connect to a duplicating node of a signal determining the safety of the conveying system, such that the first duplicated signal path of the duplicated signals leaving the node travels via the first resistor and the second duplicated signal path travels via the second resistor. After this both duplicated signal paths are taken to a signal-processing element in the interface unit, such that the first signal path is taken to a first signal-processing element and the second signal path is taken to a second signal-processing element. In some preferred embodiments of the invention, a first pull-down resistor is connected in the signal path between the aforementioned first resistor and first signal-processing element and a second pull-down resistor is connected in the signal path between the aforementioned second resistor and second signal-processing element. A first pull-up resistor is further connected in the signal path between the aforementioned first resistor and first signal-processing element, which pull-up resistor is connected to the positive signal voltage with a controllable switch, such that by closing the switch a testing signal can be supplied to a signal path from the positive signal voltage for testing the aforementioned duplicated signal paths. A second pull-up resistor is again connected in the signal path between the aforementioned second resistor and second signal-processing element, which pull-up resistor is connected to the positive signal voltage with a second controllable switch, such that by closing the switch a testing signal can be supplied to a signal path from the positive signal voltage for testing the aforementioned duplicated signal paths.

The conveying system according to the invention can be e.g. an elevator system, an escalator system or a travelator system. The term elevator system refers more particularly to an elevator system, with or without counterweight, intended for transferring passengers/freight in a vertical direction.

By means of the invention the reliability of an input circuit/interface unit can be improved by developing the supervision/diagnostics of the input circuit. For this reason it is also possible to connect e.g. a positive safety switch/ series circuit of safety switches to the input circuit. With this type of safety switch an SIL 3 safety level can be achieved without duplicating the safety switch/cabling, so that a combination of the safety switch and the interface unit according to the invention simplifies the safety circuit of the conveying system.

The aforementioned summary, as well as the additional features and advantages of the invention presented below, will be better understood by the aid of the following description of some embodiments, said description not limiting the scope of application of the invention.

MORE DETAILED DESCRIPTION OF PREFERRED EMBODIMENTS OF THE INVENTION

Figure 1:
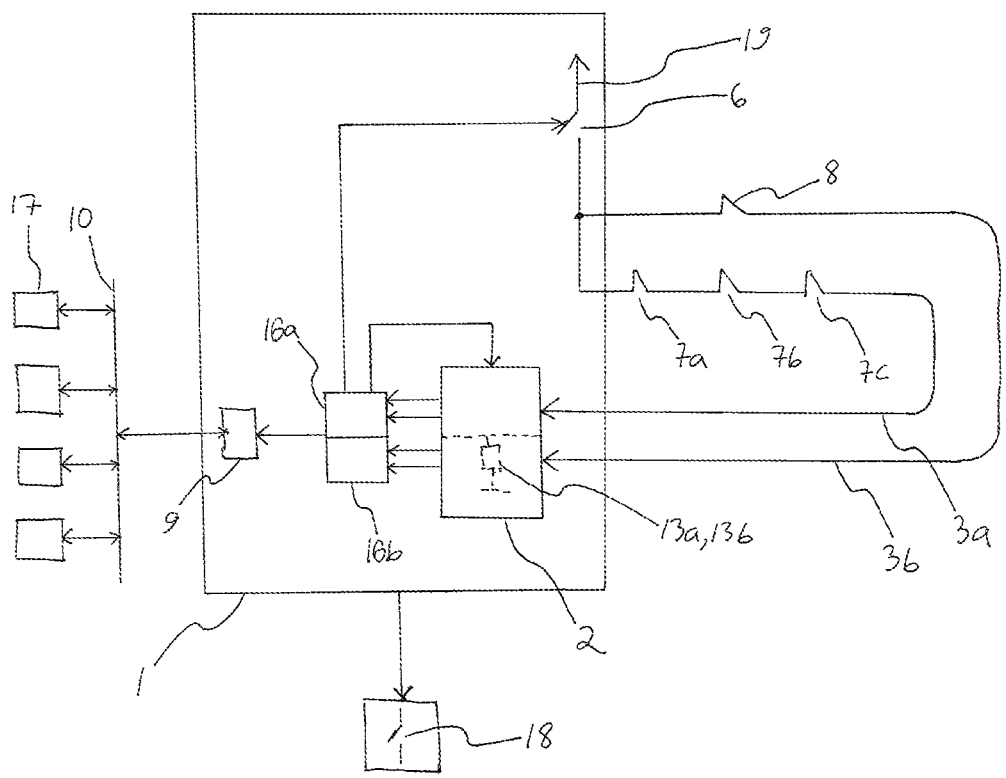
FIG. 1 presents as a block diagram a safety circuit of an elevator according to the invention

In the safety circuit of an elevator according to FIG. 1, the interface unit 1 is connected to a communications bus 10. In addition, nodes 17 are connected to the communications bus 10, with which nodes the interface unit 1 communicates via the communications bus 10 by the aid of a communications circuit 9. The size of the interface unit 1 in FIG. 1 in relation to the nodes 17 is exaggerated for illustrating the invention. In this embodiment of the invention the interface unit 1 also functions as an electronic supervision unit of the safety circuit of the elevator, which unit receives data via the communications bus 10 from the sensors connected to the nodes 17 and controls, if necessary, the safety breaker 18 of the elevator. The safety breaker 18 is a relay, the contact of which opens when the electricity supply to the control coil of the relay ceases. The contact of the relay of the safety breaker 18 is connected to the safety circuit of the elevator such that the electricity supply to the electromagnet of the machinery brakes of the hoisting machine (not presented in FIG. 1) of the elevator moving the elevator car ceases and the machinery brakes activate when the contact of the relay of the safety breaker 18 opens. In the same connection also the current supply to the electric motor of the hoisting machine is disconnected. The interface unit 1 controls the contact of the relay of the safety breaker 18 open when it detects that the safety of the elevator is endangered.

The interface unit 1 comprises an input circuit 2 for the measuring signal 3a, 3b of the sensors 7a, 7b, 7c, 8 measuring a safety-critical property of the elevator. In this embodiment of the invention the sensors 7a, 7b, 7c, 8 measuring a safety-critical property of the elevator are positive-opening safety switches, for which a safety level SIL 3 according to elevator standard EN-81 has been approved. Consequently, these safety switches can be used unduplicated, e.g. for monitoring the status/locking of the entrances to the elevator hoistway and also for monitoring the safety spaces of an end zone of the elevator hoistway.

According to FIG. 1, the safety switches 7a, 7b, 7c monitoring the status/locking of the different entrances to the elevator hoistway are connected in series to each other and the series circuit of switches is led to the input circuit 2 of the interface unit 1. The series circuit of switches also receives its operating voltage from the interface unit 1. In addition, in FIG. 1 the safety switch 8 determining the operating status of the overspeed governor of the elevator is led separately to the input circuit 2 of the interface unit 1. In this connection, it should be noted that the sensors/safety switches 7a, 7b, 7c, 8 connected to the input circuit 2 can also be selected in another manner than that presented in FIG. 1. In addition, one or more of the nodes 17 connected to the communications bus 10 can comprise an input circuit 2 according to FIG. 1, in which case the safety switches connected to the nodes in question can be read via the input circuit in a manner according to the invention.

A varying amount of nodes 17 can be connected to the communications bus 10; one node can be fitted in connection with the elevator car (not presented in FIG. 1), preferably on the roof of the elevator car, in which case a sensor measuring the position of the elevator car in the elevator hoistway as well as a sensor (not presented in FIG. 1) measuring the position of the door of the elevator car can be connected to the node. One node can be fitted in the elevator hoistway (not presented in FIG. 1), and sensors (not presented in FIG. 1) determining the limits of the permitted movement of the elevator car in the proximity of the ends of the elevator hoistway, mechanical safety devices, such as sensors determining the operating state of end buffers, et cetera, can be fitted to the node.

According to FIG. 1 the electricity supply to the safety switch 8 of the overspeed governor as well as to the series circuit of the safety switches 7a, 7b, 7c monitoring the status/locking of the entrances to the elevator hoistway occurs from the interface unit 1 from a direct-voltage current source 19 via a controllable switch 6. When reading the status of the safety switches 7a, 7b, 7c, 8 the switch 6 is closed, in which case the voltage of the DC source 19 circulates via the safety switches 7a, 7b, 7c, 8 back to the interface unit 1 into the input circuit 2. The input circuit 2 comprises a pull-down resistor 13a, 13b, via which the signal path of the signal 3a, 3b circulating via the safety switches 7a, 7b, 7c, 8 connects to the negative voltage potential of the direct-current voltage source 19. The voltage over the pull-down resistor 13a, 13b is read with a microcontroller 16a, 16b in the interface unit 1. The safety switches 7a, 7b, 7c, 8 are positive-opening switches, and the safety switches 7a, 7b, 7c open e.g. when the door of the entrance of the elevator hoistway is opened. When the safety switches 7a, 7b, 7c, 8 are closed, voltage is seen over the pull-down resistor 13a, 13b in the input circuit 2. When one of the safety switches 7a, 7b, 7c, 8 opens, the voltage between the poles of the pull-down resistor 13a, 13b goes to zero. Consequently, by reading the voltage over the pull-down resistor the state of the safety switch/series circuit of safety switches can be deduced.

One problem is that when reading the status of the safety switches 7a, 7b, 7c, 8 with an electronic interface unit 1/node 17, also the interface unit 1/node 17 reading the status of the safety switches must meet adequate safety criteria; otherwise an incorrectly determined status of the safety switch(es) might cause a dangerous situation for the user of the elevator. For example, the malfunctioning of a pull-down resistor/pull-down resistors 13a, 13b in the input circuit 2 might result in the opening of a safety switch 7a, 7b, 7c, 8 not being noticed and consequently a dangerous situation of the elevator would remain unregistered. For solving this problem the interface unit 1 of FIG. 1 is provided with means 4a, 4b, 5a, 5b, 6 for testing the operating condition of the input circuit 2. In the following the testing process of the operating condition of the input circuit 2 is described in more detail. Relating to this, FIG. 2 presents in more detail one connection of an input circuit 2 of an interface unit 1 applicable to e.g. the embodiment of FIG. 1.

Figure 2:
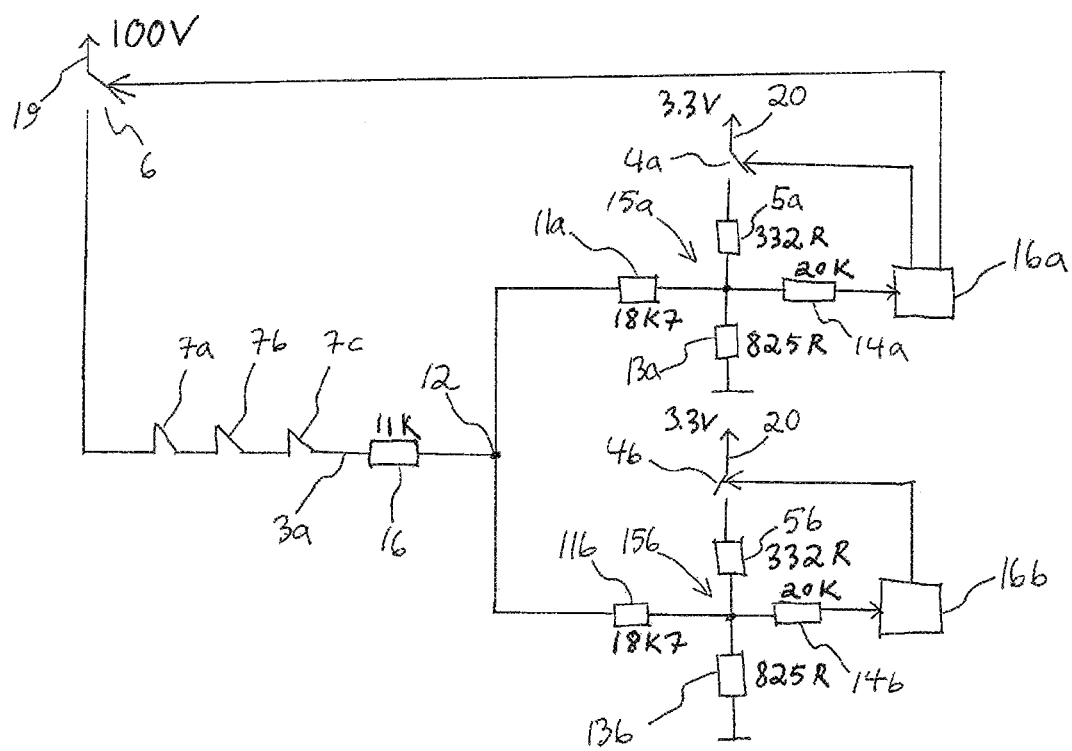
FIG. 2 presents as a block diagram a part of an input circuit according to the invention

According to FIG. 2, the measuring signal 3a of the series circuit 7a, 7b, 7c of safety switches monitoring the status/ locking of the entrances to the elevator hoistway are led to the input circuit 2 via a series resistor 16. After the series resistor 16 the signal path of the signal 3a is duplicated in the node 12 with the resistors 11a, 11b such that the first duplicated signal path 15a leaving the node 12 travels via a first resistor 11a and the second duplicated signal path 15b leaving the node 12 travels via a second resistor 11b. The interface unit 1 comprises two microprocessors 16a, 16b to which the duplicated signal paths leaving the node 12 are taken such that the first duplicated signal path 15a is taken to the first microprocessor 16a and the second duplicated signal path 15b is taken to the second microprocessor 16b. Both the duplicated signal paths 15a, 15b comprise pull-up resistors 5a, 5b and also pull-down resistors 13a, 13b between the resistors 11a, 11b connecting to the node 12 and the microprocessors. In addition, there are still separate series resistors 14a, 14b in the signal paths 15a, 15b before the microprocessor 16a, 16b. The pull-up resistors 5a, 5b are connected to the signal voltage 20 with transistors 4a, 4b for supplying testing signals to the duplicated signal paths 15a, 15b.

The input circuit 2 also comprises a similar circuit for the measuring signal 3b of the safety switch 8 of the overspeed governor as for the measuring signal 3a of the safety switches 7a, 7b, 7c monitoring the status/locking of the entrances to the elevator hoistway, although the interface of the measuring signal 3b of the safety switch 8 of the overspeed governor is omitted from FIG. 2 to simplify the circuit diagram. The measuring signal 3b of the safety switch 8 of the overspeed governor is therefore taken to the input circuit 2 in a corresponding manner such that the first microprocessor 16a reads the first duplicated signal path 15a of the signal 3b of the safety switch 8 and the second microprocessor 16b reads the second duplicated signal path 15b of the signal 3b of the safety switch 8.

The testing sequence of the operating condition of the input circuit 2 proceeds in the following manner: at the start of the testing sequence the first microprocessor 16a controls the switch 6 open, in which case the electricity supply from the direct-current source 19 to the series circuit 7a, 7b, 7c of safety switches disconnects. After the electricity supply has been disconnected, and therefore the measuring signal 3a of the series circuit 7a, 7b, 7c of safety switches has also been disconnected, the microprocessors 16a, 16b read the signal voltage in the duplicated signal paths; if the voltage in one or more of the duplicated signal paths in this case corresponds to a logical "1" level it is deduced that the input circuit 2 has failed. After this the microprocessor 16a controls the transistor 4a to be conductive, in which case a testing signal is supplied from the signal voltage 20 via the pull-up resistor 5a to the first duplicated signal path 15a. The first microprocessor 16a reads the voltage from the first duplicated signal path 15a in question; if the signal path 15a in question of the input circuit 2 is operational, the microprocessor reads a voltage corresponding to a logical "1" level. At the same time also the second microprocessor 16b reads the voltage of the same signal from the second duplicated signal path 15b. If the signal path 15b in question is operational, the second microprocessor 16b reads a voltage corresponding to a logical "0" level. Also in the rest of the duplicated signal paths of the input circuit 2 a logical "0" voltage signal is in this case read if the input circuit is in operating condition. The first 16a and the second 16b microprocessor also compare the testing results with each other, and if the testing results differ from what is permitted, i.e. if the first microcontroller 16a has read a logical "0" voltage level and/or if the second microprocessor 16b has read a logical "1" level, it is deduced that the input circuit has failed.

After this the first microprocessor 16a controls the transistor 4a to be non-conductive and the second microprocessor 16b controls the transistor 4b to be conductive, in which case a testing signal is supplied from the signal voltage 20 via the pull-up resistor 5b to the second duplicated signal path 15b. The second microprocessor 16b reads the voltage from the second duplicated signal path 15b in question; if the signal path in question of the input circuit 2 is operational, the second microprocessor reads a voltage corresponding to a logical "1" level. At the same time also the first microprocessor 16a reads the voltage of the same signal from the first duplicated signal path 15a. If the signal path 15a in question is operational, the first microprocessor 16a reads a voltage corresponding to a logical "0" level. Also in the rest of the duplicated signal paths of the input circuit 2 a logical "0" voltage signal is in this case read if the input circuit is in operating condition. The first 16a and the second 16b microprocessor also compare the testing results with each other, and if the testing results differ from what is permitted, i.e. if the second microcontroller 16b has in this case read a logical "0" voltage level and/or if the first microprocessor 16a has read a logical "1" level, it is deduced that the input circuit has failed.

After this the first 16a and the second 16b microprocessor test the circuit of the duplicated signal paths of the measuring signal 3b of the safety switch 8 of the overspeed governor in the same manner.

In addition, a test is performed in which the first 16a microprocessor controls all the transistors 4a of the first duplicated signal paths 15a to be simultaneously conductive. In this case a logical "1" voltage level should be read from each first duplicated signal path 15a and a logical "0" voltage level should be read from each second duplicated signal path 15b; otherwise it is deduced that the input circuit 2 has failed. After this the test is performed in a corresponding manner by controlling with the second microprocessor 16b all the transistors 4b of the second duplicated signal paths 15b to be simultaneously conductive.

Also during normal operation of the safety circuit the first 16a and the second 16b microprocessor compare the duplicated signal paths 15a, 15b of the same signal 3a, 3b; if the signal levels read from the duplicated signal paths of the same signal in this case differ from each other it is deduced that the input circuit has failed.

When deducing that the input circuit 2 has failed, the interface unit 1 (which is also the electronic supervision unit in the safety circuit of the elevator) sends to the elevator control unit via the communications bus 10 a control command for switching the software of the elevator system into an operating mode in which the next run of the elevator is prevented. For preventing the run, the interface unit 1 also controls a safety breaker of the elevator, which disconnects the current supply to the hoisting machine of the elevator and also activates the machinery brakes of the hoisting machine in the manner presented in the embodiment of FIG. 1.

The invention is described above by the aid of a few examples of its embodiment. It is obvious to the person skilled in the art that the invention is not only limited to the embodiments described above, but that many other applications are possible within the scope of the inventive concept defined by the claims.

The invention claimed is:

1. An interface configured to interface with one or more sensors, the interface comprising:
   an input circuit including a pull-up circuit and a pull-down circuit connected via paths to an input node of the input circuit, the input circuit configured to,
      receive, at the input node, a first sensing signal from the one or more sensors, the first sensing signal indicating a first operating condition associated with a status of one or more of an overspeed governor and an elevator door associated with the one or more sensors,
      duplicate the first sensing signal to generate duplicate sensing signals,
      transmit the duplicate sensing signals to the pull-up circuit and the pull-down circuit; and
   at least two controllers configured to,
      determine a status of the one or more sensors based on a voltage across one or more of the pull-up circuit and the pull-down circuit when the one or more sensors are electrically connected to the input circuit such that the first sensing signal is transmitted to the input circuit, and
      determine a second operating condition associated with the input circuit based on a voltage across one or more of the pull-up circuit and the pull-down circuit when the one or more sensors are electrically disconnected from the input circuit such that the first sensing signal is not transmitted to the input circuit.

2. The interface according to claim 1, further comprises:
   a switch configured to electrically disconnect the one or more sensors from the input circuit, wherein
   the interface is configured to determine the second operating condition of the input circuit when the one or more sensors are disconnected.

3. The interface according to claim 2, wherein the the switch is configured to disconnect a power supply associated with the one or more sensors.

4. The interface according to claim 1, wherein the interface is configured to supply a testing voltage to the input circuit.

5. The interface according to claim 4, wherein the interface is configured to supply the testing voltage to the input circuit while the one or more sensors remain electrically disconnected from the input circuit such that the first sensing signal is disconnected from the input circuit.

6. The interface according to claim 5, wherein the interface is configured to sequentially apply the testing voltage to each of the paths.

7. The interface according to claim 1, wherein the interface further comprises:
   a communication circuit configured to transmit a message to the one or more sensors via a communication bus.

8. The interface according to claim 1, wherein the input circuit includes the input node for duplicating the first sensing signal arriving in the input circuit.

9. The interface according to claim 8, wherein the at least two controllers includes a first controller configured to receive a first one of the duplicate sensing signals via a first one of the paths and a second controller configured to receive a second one of the duplicate sensing signals via a second one of the paths.

10. The interface according to claim 1, wherein
    the one or more sensors include a first sensor and a second sensor, the first sensor configured to generate the first sensing signal, and the second sensor configured to generate a second sensing signal,
    the input circuit is configured to receive, via the input node, the first sensing signal and the second sensing signal, and to provide the first sensing signal and the second sensing to the paths, and
    the interface is configured to sequentially determine the operating condition of the paths.

11. The interface according to claim 10, wherein the interface is configured to determine the second operating condition of the input circuit when the first sensing signal and the second sensing signal are disconnected from the input circuit.

12. The interface according to claim 1, wherein the one or more sensors include one or more a safety switches connected in series.

13. A conveying system, comprising:
    an interface according to claim 1.

14. The interface according to claim 1, wherein the at least two controllers are configured to determine the second operating condition by determining if one or more of the pull-up circuit and the pull-down circuit have a first logic level when the one or more sensors are electrically disconnected from the input circuit.

15. The interface according to claim 14, wherein the at least two controllers are configured to determine the second operating condition by further determining whether one or more of the pull-up circuit and pull-down circuit switch from the first logic level to a second logic level when a testing voltage is applied to each of the paths while the one or more sensors remain electrically disconnected from the input circuit.

16. The interface according to claim 15, wherein the interface is configured to determine a fault situation in the input circuit, if the pull-up circuit and pull-down circuit in a respective one of the paths associated with the first one of the duplicate sensing signals do not switch from the first logic level to the second logic level when the testing voltage is applied to the respective one of the paths.

17. The interface according to claim 15, wherein the interface is configured to determine a fault situation in the input circuit, if the pull-up circuit and pull-down circuit in a respective one of the paths associated with the second one of the duplicate sensing signals do not switch from the first logic level to the second logic level when the testing voltage is applied to the respective one of the paths.

18. A method for monitoring an operating condition of an input circuit included in an interface, the interface configured to interface with one or more sensors, the method comprising:
    receiving, at an input node of the input circuit, a first sensing signal from the one or more sensors, the first sensing signal indicating a first operating condition associated with a status of one or more of an overspeed governor and an elevator door associated with the one or more sensors;
    duplicating the first sensing signal to generate duplicate sensing signals;
    transmitting the duplicate sensing signals to a pull-up circuit and a pull-down circuit connected via paths to the input node of the input circuit;
    first determining a status of the one or more sensors based on a voltage across one or more of the pull-up circuit and the pull-down circuit when the one or more sensors are electrically connected to the input circuit such that the first sensing signal is transmitted to the input circuit; and
    second determining a second operating condition associated with the input circuit based on a voltage across one or more of the pull-up circuit and the pull-down circuit when the one or more sensors are electrically disconnected to the input circuit such that the first sensing signal is not transmitted to the input circuit.

19. The method according to claim 18, wherein the second determining further comprises:
disconnecting the one or more sensors from a power supply thereof.

20. The method according to claim 18, wherein the second determining includes applying a testing voltage to each of the paths.

21. The method according to claim 18, wherein the one or more sensors include one or more safety switches connected in series.

22. The method according to claim 18, wherein the second determining includes determining if one or more of the pull-up circuit and the pull-down circuit have a first logic level when the one or more sensors are electrically disconnected from the input circuit.

23. The method according to claim 22, wherein the second determining further includes determining whether one or more of the pull-up circuit and pull-down circuit switch from the first logic level to a second logic level when a testing voltage is applied to each of the paths while the one or more sensors remain electrically disconnected from the input circuit.

* * * * *